United States Patent [19]

Geissler

[11] Patent Number: 4,572,887

[45] Date of Patent: Feb. 25, 1986

[54] RADIATION-POLYMERIZABLE MIXTURE WITH CROSSLINKABLE BINDER

[75] Inventor: Ulrich Geissler, Frankfurt, Fed. Rep. of Germany

[73] Assignee: Hoechst Aktiengesellschaft, Frankfurt am Main, Fed. Rep. of Germany

[21] Appl. No.: 640,139

[22] Filed: Aug. 13, 1984

[30] Foreign Application Priority Data

Aug. 16, 1983 [DE] Fed. Rep. of Germany ....... 3329443

[51] Int. Cl.$^4$ .............................................. G03C 1/68
[52] U.S. Cl. .................................... 430/288; 430/281; 430/284; 430/905; 522/116; 522/117
[58] Field of Search ............... 430/288, 284, 905, 281, 430/270; 204/159.15, 159.16

[56] References Cited

U.S. PATENT DOCUMENTS

| | | | |
|---|---|---|---|
| 3,261,686 | 7/1966 | Celeste et al. | 430/288 |
| 4,230,793 | 10/1980 | Losert et al. | 430/315 |
| 4,247,621 | 1/1981 | Sano et al. | 430/269 |
| 4,278,752 | 7/1981 | Gervay et al. | 430/281 |
| 4,290,870 | 9/1981 | Kondoh et al. | 430/288 |
| 4,304,923 | 12/1981 | Rousseau | 430/284 |
| 4,435,496 | 3/1984 | Walls et al. | 430/288 |
| 4,438,189 | 3/1984 | Geissler et al. | 430/280 |

FOREIGN PATENT DOCUMENTS

| | | |
|---|---|---|
| 15004 | 9/1980 | European Pat. Off. . |
| 2509842 | 9/1975 | Fed. Rep. of Germany . |

*Primary Examiner*—Jack P. Brammer
*Attorney, Agent, or Firm*—Schwartz, Jeffery, Schwaab, Mack, Blumenthal & Evans

[57] ABSTRACT

Disclosed is a radiation-polymerizable mixture which includes a polymerizable compound, a radiation-activatable polymerization initiator and a polymeric binder with lateral cross-linking groups of the formula $$-CH_2OR,$$

wherein R denotes a hydrogen atom or a lower alkyl group, a lower acyl group or a lower hydroxyalkyl group. The mixture is cured by heating after development. Also disclosed is a polymerizable copying material which includes a layer comprising the mixture and a process for producing a solder mask including a laminating step for laminating a photoresist layer which includes the layer.

14 Claims, No Drawings

RADIATION-POLYMERIZABLE MIXTURE WITH CROSSLINKABLE BINDER

BACKGROUND OF THE INVENTION

The present invention relates to a radiation-polymerizable mixture which comprises, (a) a compound which has at least two terminal ethylenically unsaturated groups and which forms a cross-linked polymer by means of addition chain polymerization initiated by free radicals, (b) a polymeric binder, and (c) a radiation-activatable polymerization initiator.

The mixture is preferably used as a photoresist material which can be transferred dry and used for producing solder masks.

It is known to produce solder masks on printed circuit boards by the photoresist technique. As in the production of printed circuits, thermoplastic photopolymerizable layers are laminated onto the printed circuit board by means of pressure and heat and are hardened in imagewise fashion by exposure in those areas where the printed circuit board is to be covered. The solder mask is obtained by washing away the unexposed layer areas.

Materials of this type are described, for example, in German Offenlegungsschrift No. 2,747,947. The materials comprise photopolymerizable layers which contain a certain amount of a bonded halogen to improve their flame-resistance. European Patent Application No. 15,004 describes a similar material which can be developed dry by mechanically separating exposed and unexposed layer areas ("peel-apart process"). Finally, European Patent Application No. 2,040 describes a light-hardenable material for the same purpose, in which the light-sensitive compounds are identified as light-sensitive epoxy resins, but are not described in more detail.

Photopolymerizable mixtures known and used for producing photoresist masks are transferred dry with heat onto the printed circuit board to be masked. Therefore, the materials must necessarily be thermoplastic. However, for use as solder masks, this thermoplasticity is disadvantageous since the masks must withstand temperatures above 200° C. without decomposing and without melting or significant softening. Admittedly, the photopolymer layer is hardened to a considerable extent in the exposed areas by cross-linking polymerization, and this light-hardening can be further enhanced in a known way by re-exposure of the developed image stencil. However, the basic tendency of all known photopolymerizable layers to soften when heated remains.

In accordance with German Offenlegungsschrift No. 3,114,931 (equivalent to U.S. Ser. No. 366,379 filed Apr. 7, 1982 now U.S. Pat. No. 4,485,166) a bis-epoxy compound is added to the photopolymerizable mixture used for producing the solder mask, and the light-hardened image stencil is post-cured by heat treatment after developing in order to overcome the above-stated disadvantage. This process produces highly heat-resistant solder masks. However, the photopolymerizable mixture produced in this way has the disadvantage that its shelf life is shorter than that of an otherwise identical mixture which does not contain any epoxy compound.

European Patent Application No. 73,444 discloses similar mixtures which in the unexposed state have an improved shelf life. These mixtures contain compounds which are thermally cross-linkable with the binder, with the polymerization product of the ethylenically unsaturated compound, and/or with themselves. Preference is given to compounds in which the cross-linking groups are epoxy groups or groups of the formula

—CH$_2$—O—R, wherein R denotes a hydrogen atom or a lower alkyl, acyl or hydroxy-alkyl group, and the groups —CH$_2$OR are bonded to a nitrogen atom of a low molecular weight, open-chain or cyclic acid amide or to an aromatic carbon atom of a compound which is capable of undergoing a condensation reaction with formaldehyde.

However, the mixtures described in the above publication still possess two significant drawbacks. Under particular soldering conditions, threads or pellets of the solder alloy adhere to the surface of the solder mask after wave-soldering. This occurrence, which probably is due to the softening of the layer, may possibly lead to short circuits.

Furthermore, in the fully cured state, the mixtures according to European Patent Application No. 73,444 possess an unsatisfactory resistance to solvents. As a consequence thereof, softening of the solder masks may occur during the cleaning of the soldered printed circuit boards. In addition, the dyestuff is partially dissolved out of the layer if the solvents, such as, for example, ethanol, are allowed to interact with the layer over a prolonged period.

SUMMARY OF THE INVENTION

It is therefore an object of the present invention to provide an improved photopolymerizable mixture which is suitable for the production of thermally post-curable image stencils.

Another object of the present invention is the provision of a photopolymerizable mixture having a shelf life equal to that of known mixtures while providing exposure products which possess an increased hardness and an improved resistance to solvents.

Yet another object of the present invention is to provide a radiation polymerizable copying material which includes a layer of the above-characterized photopolymerizable mixture.

Still another object of the present invention is the provision of a process for the production of a solder mask having a dry solid photopolymerizable photoresist layer having the above-noted properties.

Therefore, in accordance with one aspect of the present invention there has been provided a radiation-polymerizable mixture comprising a compound which has at least two terminal ethylenically unsaturated groups and which forms a cross-linked polymer by means of addition chain polymerization initiated by free radicals, a polymeric binder, and a radiation-activatable polymerization initiator, wherein the binder comprises a polymer having lateral cross-linking groups of the formula —CH$_2$OR, R denoting a hydrogen atom, a lower alkyl group, a lower acyl group or a lower hydroxyalkyl group.

In accordance with the present invention, there has been provided a radiation-polymerizable copying material, comprising a flexible, transparent, temporary layer support, and a transferable thermoplastic radiation-polymerizable layer which includes a compound which has at least two terminal ethylenically unsaturated groups and which forms a cross-linked polymer by means of addition chain polymerization initiated by free radicals, a polymeric binder, and a radiation-activatable polymerization initiator. The radiation-polymerizable layer includes, as the binder, a polymer having lateral cross-linking groups of the formula —CH$_2$OR, R denoting a hydrogen atom, a lower alkyl group, a lower acyl group or a lower hydroxyalkyl group.

In yet another aspect of the present invention there has been provided a process for producing a solder mask comprising the steps of laminating a dry, solid, photopolymerizable, photoresist layer provided on a transparent temporary layer support, which includes a compound which has at least two terminal ethylenically unsaturated groups and which forms a cross-linked polymer by means of addition chain polymerization initiated by free radicals, a polymeric binder, and a radiation-activatable polymerization initiator, onto the surface of a printed circuit by applying pressure and heat; imagewise exposing the photoresist layer, with the exception of the solder pad areas; peeling the layer support from the photoresist layer; removing the unexposed layer areas by washing the photoresist layer with a developer; and heating the resulting solder mask to an elevated temperature between about 80° and 150° C. for about 10 to 60 minutes. The photoresist layer includes, as the binder, a polymer with lateral cross-linking groups of the formula —CH$_2$OR, R denoting a hydrogen atom, a lower alkyl group, a lower acyl group or a lower hydroxyalkyl group.

Further objects, features and advantages of the present invention will become apparent from the detailed description of preferred embodiments which follows.

DETAILED DESCRIPTION OF PREFERRED EMBODIMENTS

According to the present invention, there is disclosed a radiation polymerizable mixture which comprises:

(a) a compound which has at least two terminal ethylenically unsaturated groups and which forms a cross-linked polymer by means of addition chain polymerization initiated by free radicals, (b) a polymeric binder, and (c) a radiation-activatable polymerization initiator.

The binder of the present invention comprises a polymer having lateral cross-linking groups of the formula

in which R denotes a hydrogen atom, a lower alkyl group, a lower acyl group or a lower hydroxyalkyl group.

Preferably, the polymer is a copolymer which comprises units of the formula:

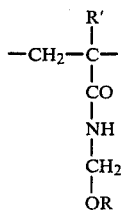

in which
R' denotes a hydrogen atom or a methyl group, and
R has the above-indicated meaning.

If R is an alkyl group, it generally comprises from about 1 to 6, preferably about 1 to 4, carbon atoms; if R is an acyl group, it generally comprises from about 1 to 4, preferably about 1 or 2, carbon atoms. In general, preference is given to compounds wherein R is an alkyl group.

In addition to the units of the above formula, the copolymer may include further units, whereby preference is given to units which yield polymers having a low Tg value (Tg=glass transition temperature) and, in particular, comprising acrylic or methacrylic acid ester units.

Upon being heated in the presence of polymers with free hydroxyl groups or, preferably, free carboxyl groups, polymers containing the above described monomer units yield cross-linked products. Therefore, they can be present in a mixture with polymeric binders which carry such substituents. Binders which include both types of substituents in one molecule are preferably employed. Terpolymers of substituted acrylic or methacrylic acid amides, acrylic or methacrylic acid and alkyl esters of acrylic or methacrylic acid are particularly suitable. Special preference is given to methacrylic acid esters, in particular to those which comprise from about 4 to 12 carbon atoms in their alkyl groups. If acrylic acid esters are used, the alkyl group can be shorter.

Additionally, the polymers can contain minor amounts of interpolymerized hydroxyalkyl acrylates or hydroxyalkyl methacrylates.

The cross-linking density achieved during the heating of the mixture depends on the ratio of substituted acid amide groups to the carboxylic acid groups and/or OH-groups. The molar ratio of ROCH$_2$NH to COOH advantageously varies between about 0.2:1 and about 1.5:1, preferably between about 0.5:1 and about 1.1:1.

The quantitative proportion of carboxyl group-containing units in the copolymer is determined by the demand for a trouble-free, rapid development with aqueous-alkaline solutions which are preferably free from organic solvents, and for the highest possible degree of developer resistance of the exposed areas. To a small extent, these properties are also influenced by the mean molecular weight and the chemical and molecular non-uniformity of the polymer. In general, the acid number should vary between about 50 and 250, preferably between about 100 and 220. In those cases where it is possible to use a developer which includes organic solvents, the acid number can be smaller.

The preferred terpolymers usually comprise about 15 to 60% by weight, preferably about 20 to 50% by weight, of substituted acid amide units. The quantitative proportion of acrylic or methacrylic acid units is selected in accordance with the above-specified acid numbers. Normally, the proportion is from about 10 to 35% by weight. The amount of alkyl acrylate or alkyl methacrylate is within a range of about 25 to 75% by weight. Methacrylic acid in its free form or in the form of its alkyl ester is preferred over acrylic acid.

The quantitative proportion of binders in the polymerizable mixture is within a range of about 40 to 90% by weight, preferably of about 55 to 85% by weight, relative to the nonvolatile constituents of the mixture.

The binders are preferably prepared by means of a free-radical polymerization in organic solvents, for example, butanone or ethanol.

Any form of electromagnetic radiation, the energy of which is sufficient to trigger polymerization, is possible for use as an actinic radiation, to which the mixture according to the invention is sensitive. Particularly suitable are visible and ultraviolet light, X-ray, γ and electron radiation. Laser radiation in the visible and in the UV region can also be used. Short-wave visible and long-wave UV light is preferred.

Polymerizable compounds used are, in general, esters of acrylic or methacrylic acid with polyhydric, preferably primary, alcohols. The alcohol should comprise from about 2 to about 4 hydroxyl groups since the cross-linking action desired is achieved by polyunsaturated compounds. The mixture can also include minor quantities of esters of monohydric alcohols or of alcohols which have more hydroxyl groups. Examples of suitable polyhydric alcohols are ethylene glycol, propylene glycol, butane-1,4-diol, butane-1,3-diol, diethylene glycol, triethylene glycol, polyethylene glycols or polypropylene glycols having molecular weights from about 200 to about 1,000, neopentylglycol, trimethylolethane, trimethylolpropane, pentaerythritol and oxyethylated bisphenol A derivatives. Low-molecular bis-acrylates and bis-methacrylates which comprise urethane groups and which are obtained by reacting about 2 moles of a hydroxyalkyl acrylate or hydroxyalkyl methacrylate with 1 mole of an aliphatic or cycloaliphatic diisocyanate, for example, 2,2,4-trimethylhexamethylene diisocyanate, are also suitable. Monomers of this type, containing urethane groups, are described in U.S. Pat. No. 4,088,498. Similar suitable monomers are described in German Offenlegungsschriften No. 2,822,190 and No. 3,048,502.

Mixtures of various monomers can also be used. It is, for example, possible to combine monomers of the above-mentioned type with high-molecular weight monomers which comprise urethane groups and have the general formula:

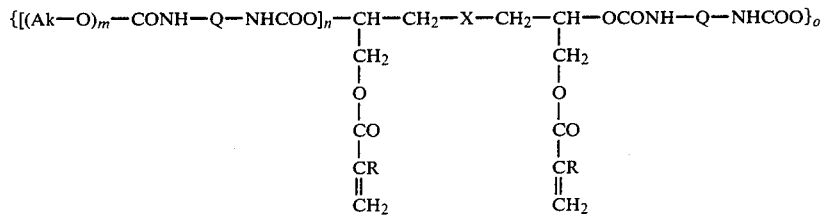

in which

Q is a bivalent mononuclear or binuclear aromatic radical which is unsubstituted or substituted by lower alkyl groups and which can contain a lower alkylene group as a connecting member, X is one of the groups

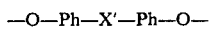

and

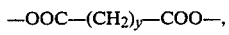

in which Ph is an optionally substituted phenylene group, X' is an alkylene group having about 1–4 carbon atoms and y is a number from about 2 to 12, R is a hydrogen atom or a methyl group, Ak is an alkylene radical having about 2–4 carbon atoms, m is a number from about 4 to 50, n is a number from about 1 to 6 and o is a number from about 4 to 20.

These polyether ester urethanes are prepared in a known manner by reacting oligomeric diisocyanates with bis-acrylic acid ester diols.

The preparation and use of these compounds has been described in European Patent Application No. 48,913, the disclosure of which is incorporated by reference herein.

These polyurethanes, in general, have reduced specific viscosities (RSV) of about 0.15 to 1.4 dl/g, measured on 1% strength solutions in dimethyl formamide at 25° C. Products having RSV values within a range from about 0.2 to 0.9 dl/g are preferable.

The total amount of polymerizable compounds is, in general, between about 10 and 60, preferably between about 15 and 45 percent by weight, relative to the non-volatile proportions of the mixture. Of this amount, about 2 to 20, preferably about 5 to 10, percent by weight, relative to the same basis, can include polyurethanes of the general formula given above.

Apart from the above-described cross-linkable polymers, the mixtures according to the present invention can comprise other known, preferably saturated, binders. Water-insoluble binders which are soluble or at least swellable in aqueous-alkaline solutions are preferably used. Furthermore, the mixtures can include low molecular-weight, thermally cross-linkable mixtures of the type described in European Patent Application No. 73,444, in particular methoxymethyl melamines. These compounds can be admixed in amounts of about 0.5 to 30 percent by weight, preferably of about 5 to 25 percent by weight, relative to the non-volatile constituents of the mixture.

A large number of substances can be used as photoinitiators in the mixture according to the present invention. Examples include benzoin and its derivatives, polynuclear quinones, trichloromethyl-s-triazines, acridine derivatives, for example, 9-phenylacridine, 9-p-methoxyphenyl-acridine, 9-acetylamino-acridine or benz(a)acridine; phenazine derivatives, for example, 9,10-dimethylbenzo(a)phenazine, 9-methylbenzo(a)phenazine or 10-methoxybenzo(a)phenazine, quinoxaline derivatives, for example, 6,4',4"-trimethoxy-2,3-diphenylquinoxaline, 4'4"-dimethoxy-2,3-diphenyl-5-azaquinoxaline and quinazoline derivatives. The acridine, phenazine and quinoxaline derivatives are preferred. The photoinitiators, in general, are present in an amount of from about 0.01 to 10% by weight, preferably about 0.05 to 2% by weight.

The mixtures preferably contain at least one dyestuff to make the developed resist stencil more visible. For this purpose a combination of at least two dyestuffs is advantageously used, of which one dyestuff changes its color on irradiation and is destroyed, i.e., becomes colorless, at temperatures above 200° C. The other dyestuff should be able to survive not only irradiation but also temperatures above about 200° C. without change. It should make the solder mask clearly visible during soldering and thereafter.

Suitable examples of dyestuffs which change color on exposure are triphenylmethane dyestuffs and certain azo dyestuffs, as described in German Offenlegungsschrift No. 2,807,933 (=U.S. Pat. No. 4,241,166).

Suitable light- and heat-resistant dyestuffs include oxazolone dyestuffs, for example, a dyestuff of the formula:

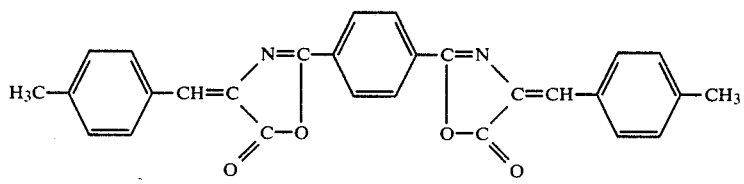

or anthraquinone dyestuffs, for example, 1,4-bis-(4-tert.-butoxy-phenylamino)-5,8-dihydroxyanthraquinone.

Mixtures according to the present invention can also contain, in addition to monomers, binders, photoinitiators and dyestuffs, a series of other customary additives, for example, inhibitors to prevent the thermopolymerization of the monomers, hydrogen donors, sensitometric regulators, pigments, plasticizers, and flame retardants.

The mixture according to the present invention is preferably used as a photoresist, in particular as a solder mask. For this purpose, the mixture can be applied in a known manner from a solution or as a prefinished transferable dry resist film to the workpiece to be processed, for example, a printed circuit board. The mixture is preferably processed into a dry resist material. In general, a solution of the mixture in a solvent is applied to a suitable support, for example, a polyester film, and dried. The layer thickness of the resist layer can be about 10 to 150 μm, preferably about 20 to 120 μm. The free surface of the layer is preferably covered with a top film, for example, of polyethylene or polypropylene. The finished laminate can be stored in the form of a full width roll which, if the case demands, can be cut into resist rolls of any width desired.

Even after months of storage at 20° C., the resist rolls remain unchanged and can be processed without problems, and the cut eges remain completely free of resist outflows which lead to sticking. Resist layers stored for more than aout 2 months at 40° C. in a drying cabinet show no differences, compared to freshly prepared layers, in respect to laminatability, developability and soldering resistance.

The film can be processed by means of the equipment customary in dry resist technology. In a commercially available laminating device the covering film is peeled off and the solder mask layer is laminated onto the printed circuit board which is to be protected and which has been provided, for example, with metalized bores. The board thus prepared is then exposed through an original which protects those parts of the board from irradiation which must be left free for the soldering process.

The resist layers, after being freed from the support film, are developed in a known manner. Suitable developers are aqueous, preferably aqueous-alkaline, solutions, for example, of alkali metal phosphates, alkali metal carbonates or alkali metal silicates, to which, if desired, small amounts, for example, up to about 10% by weight of wetting agents or organic solvents which are miscible with water can be added.

Fully prepared printed circuit boards, covered by the process steps just described, must then be subjected to a heat treatment before the soldering process. It is assumed that in this treatment an interpenetrating network is formed which is responsible for the good mechanical, thermal and chemical properties of the solder masks. This thermal treatment is, in general, carried out at temperatures between about 80° C. and 150° C. for treatment times of about 10 to 60 minutes.

The board which is ready for soldering can be equipped with electronic component parts, the connectors of which are bent across the corresponding lines of the circuit in those areas which are laid bare in the developing process.

The conducting side of the board can then be treated with a suitable, commercially available soldering flux and subjected to wave soldering in a commercially available wave soldering machine.

The soldering fluxes used are known eutectic mixtures which permit soldering temperatures of about 230° C. to 260° C. A known mixture contains, for example, about 63% by weight of tin and 37% by weight of lead.

Solder masks according to the present invention can also be used successfully in processes in which double-sided, through-hole plated printed circuit boards are soldered by dipping into liquid metal baths.

The mixtures according to the present invention produce solder mask layers which are distinguished by a high flexibility and mechanical strength in the unexposed and exposed state and by a high heat resistance in the exposed and post-cured state. The photopolymerizable layers exhibit, in combination with the preferred photoinitiators, a high sensitivity to light. Also, satisfactory curing or crosslinking throughout the layer is obtained, even when thick layers are present. Even in the case of thicknesses above about 100 μm, the exposed layers can be developed perfectly and completely by means of aqueous-alkaline solutions.

The exposed and developed layers can be thermally cured without an excessive impairment of the flexibility of the mask or of its adhesion to the substrate and without alteration of the position and dimensions of the areas laid bare by developing. The cured masks are resistant to atmospheric, thermal and, in particular, chemical influences for prolonged time periods.

Even after the prolonged action of, for example, ethanol for a period of 24 hours, no softening of the masks is observed, nor are any components, such as, for example, dyestuff, dissolved out of the layer. After the solvent treatment, the adhesion of the solder mask both to the circuit paths and to the printed circuit board base is still excellent. This solvent resistance is of great importance, for alcohol-containing solutions are used to remove the soldering flux. The solder masks obtained from the mixtures according to the present invention are particularly suitable for protecting sensitive electronic conductor structures from atmospheric attack in an effective and lasting way.

Although, in the above descriptive section the invention has been preferably described with regard to its use for the manufacture of solder masks, it is not restricted to this use. It is applicable in any situation where the object is to produce imagewise stencils of particularly high thermal, mechanical and chemical resistance. This is also the case in other photoresist applications, for example, in the production of electroplating stencils, which are intended to be resistant to aggressive baths and/or to elevated temperatures.

Processing of the mixture is preferably performed by means of the dry resist technique, as described above. However, the mixture is also well suited for being processed by means of the liquid resist technique, i.e., by applying a solution of the components to the final layer support in the production of printed circuit boards and of solder masks.

The mixture, according to the invention, is suitable also for the manufacture of offset printing plates, for example, using aluminum, steel or chromium as support materials. The plates are intended to be baked in known manner, after developing, to consolidate the image stencil. This process is described in British Pat. No. 1,154,749. However, in this mode of application, heating should be carried out for a shorter time and at higher temperatures, in general for about 2 to 20 minutes at temperatures within a range of about 200° to 250° C. This can considerably increase the print run.

The examples which follow illustrate particular embodiments of the mixture according to the present invention. Unless otherwise indicated, percentages and quantity ratios are to be understood as units by weight. The quantities in the formulations are given in parts by weight (p.b.w.).

EXAMPLE 1

Coating solutions were prepared from:
52 p.b.w. of one of the following terpolymers
(a) N-butoxymethyl-methacrylamide, methacrylic acid, hexylmethacrylate (25:25:50),
(b) N-butoxymethyl methacrylamide, methacrylic acid, decyl methacrylate (23:30:47),
(c) N-butoxymethyl methacrylamide, acrylic acid, hexyl methacrylate (47:18:35) or
(d) (comparison) styrene, methacrylic acid, hexyl methacrylate (10:30:60),
17.6 p.b.w. of polyethylene glycol-400-dimethacrylate,
4 b.p.w. of hexamethoxymethyl melamine,
0.8 p.b.w. of 9-phenyl acridine,
0.04 p.b.w. of a blue azo dyestuff obtained by coupling 2,4-dinitro-6-chlorobenzene diazonium salt with 2-methoxy-5-acetyl-amino-N,N-diethyl aniline, and
0.12 p.b.w. of 1,4-bis-(4-tert.-butoxyphenylamino)-5,8-dihydroxyanthraquinone, in
90 p.b.w. of butanone and
50 p.b.w. of ethanol.

Each of the solutions was coated onto a 25 μm thick biaxially oriented thermoset polyethylene terephthalate film by means of a coating apparatus. After passing through a drying zone the resist layers had a thickness of 100 μm each and were covered with a polypropylene film. The dry resist films thus produced were then cut, by means of a slitter, into manageably sized resist rolls having a width of 30 cm and a web length of 50 m.

After the top films had been stripped off, the resist layers were laminated, by means of a customary laminating appliance, to a phenoplast laminate board clad with a 35 μm thick copper foil and were exposed for 20 seconds using a commercially available exposure device (5 kW metal halide lamp). Exposure can take place prior to or after the removal of the support film. The original employed was a 13-step exposure wedge having density increments of 0.15. Thereafter, the plates were developed with a 0.8% strength soda solution in a spray processor.

The following table indicates the developing times t and the number of fully crosslinked wedge steps; the numbers in parantheses give the total number including the ghost steps.

|  | (a) | (b) | (c) | (d) (comparison) |
|---|---|---|---|---|
| Wedge steps | 10 (11) | 9 (10) | 6 (8) | 8 |
| t (seconds) | 110 | 200 | 105 | 105 |

For soldering tests, test boards of rigid epoxy glass fabric with about 65 μm thick conducting paths having a thinned surface and plated-through holes were used. The widths and mutual distances of the conducting paths were between 200 and 1,000 μm, the hole diameters were 0.6 to 4 mm.

The solder resist layers described above were laminated onto these boards at 115° C., using a commercially available laminating device.

The boards were then exposed for 20 seconds through an original which covered the pads to be soldered, developed with a 0.8% strength soda solution and blown dry. Subsequently, the printed circuit boards treated in this way were cured for 60 minutes in a drying cabinet at 150° C. Thereafter, the cooled boards were wetted with the soldering flux TL 33-16, produced by Alpha Grillo, and then passed, at a speed of 1 m/min, through a commercially available wave soldering bath having a temperature of 250° C.

None of the soldered boards showed any signs of chipping. No tin residues were left on the solder resist areas of boards (a), (b) and (c), whereas so-called "tin cobwebs" were clearly visible on layer (d).

After soldering, each board was cleaned for one minute in a mixture composed of 65 percent by weight of 1,1,2-trichloro-1,2,2-trifluoroethane and 35 percent by weight of 2-propanol, and for 1 minute in pure 1,1,2-trichloro-1,2,2-trifluoroethane in an ultrasonic bath.

Before and after the solvent treatment, the respective hardness of the solder mask was determined.

The hardness tests were performed by means of the indentation hardness test according to Buchholz, which is described in DIN 53 153.

In this test, the penetration of a disk knife, under a specified load, into the layer to be tested, is measured by means of a suitable apparatus. The softer the material to be tested, the longer is the indentation. The hardness number then corresponds to $$\frac{100}{\text{indentation length (mm)}}$$

Furthermore, the ratio of the hardness values determined before and after the solvent treatment is a measure for the softening or swelling behavior of the layer under the influence of organic solvents.

Additionally, portions of the soldered boards were immersed in ethanol for 24 hours, in order to test their resistance to solvents and thus their degree of curing.

The results are compiled in the table below:

|  | (a) | (b) | (c) | (d) (comparison) |
|---|---|---|---|---|
| Buchholz hardness before/after cleaning | 80/79 | 82/83 | not tested | 72/48 |
| After 24 hours in ethanol | solder mask on printed circuit board unchanged | | | dyestuff dissolved out of solder mask |

EXAMPLE 2

The following coating solutions were prepared:
52 p.b.w. of one of the following terpolymers:
 (a) N-butoxymethyl methacrylamide, acrylic acid, hexyl methacrylate (26:22:52)
 (b) N-butoxymethyl methacrylamide, methacrylic acid, ethyl acrylate (31:32:37)
4 p.b.w. of an elastomeric reaction product of glycidyl methacrylate, adipic acid and an oligomeric diisocyanate, obtained by reacting tolylene diisocyanate with a polytetramethylene ether diol (see German Offenlegungsschrift No. 30 36 694)
17.6 p.b.w. of polyethylene glycol-400-dimethacrylate,
4 p.b.w. of hexamethoxymethyl melamine,
0.8 p.b.w. of 9-phenyl acridine,
0.04 p.b.w. of the blue dyestuff described in Example 1, and
0.12 p.b.w. of the anthraquinone dyestuff described in Example 1, in
80 p.b.w. of butanone, and
50 p.b.w. of ethanol.

As described in Example 1, 100 μm thick solder resist layers were prepared from these solutions. The layers were processed as described in Example 1. The results are compiled in the table below:

|  | (a) | (b) |
|---|---|---|
| Exposure time (sec) | 20 | 20 |
| Wedge steps | 6 (8) | 7 (10) |
| t (sec) | 65 | 120 |
| 24 hours in ethanol | Solder mask on printed circuit board unchanged | |

EXAMPLE 3

The following coating solutions were employed as described in Example 1:

(a)

39 p.b.w. of a styrene/methacrylic acid/hexyl methacrylate terpolymer (10:30:60)
13 p.b.w. of a N-methoxymethyl methacrylamide/hexyl methacrylate copolymer (50:50),
8 p.b.w. of the elastomer described in Example 2,
22 p.b.w. of polyethylene glycol-400-dimethacrylate,
5 p.b.w. of hexamethoxymethyl melamine,
1 p.b.w. of 9-phenylacridine,
0.05 p.b.w. of the blue dyestuff described in Example 1, and
0.15 p.b.w. of the anthraquinone dyestuff described in Example 1, in
210 p.b.w. of butanone.

(b)

52 p.b.w. of a N-butoxymethyl methacrylamide/methacrylic acid/hexyl methacrylate terpolymer (36:28:36)
6.4 p.b.w. of the elastomer described in Example 2,
17.6 p.b.w. of polyethylene glycol-400-dimethacrylate,
4 p.b.w. of hexamethoxymethyl melamine,
0.8 p.b.w. of 9-phenylacridine,
0.04 p.b.w. of the blue dyestuff described in Example 1, and
0.12 p.b.w. of the anthraquinone dyestuff described in Example 1, in
90 p.b.w. of butanone, and
70 p.b.w. of ethanol.

Here, too, solder masks possessing a very good solvent resistance were obtained, without any tin cobwebs remaining after soldering. The results are compiled in the table which follows:

|  | (a) | (b) |
|---|---|---|
| Exposure time (sec) | 20 | 20 |
| Wedge steps | 7 (9) | 9 |
| t (sec) | 120 | 80 |
| Buchholz hardness before/after cleaning | 59/60 | 86/79 |
| 24 hours in ethanol | Solder mask on printed circuit board unchanged | |

EXAMPLE 4

A coating solution was prepared from:
2 p.b.w. of the terpolymer described in Example 1a,
2 p.b.w. of a diurethane prepared from 2 moles of glycerol dimethacrylate and 1 mole of hexamethylene diisocyanate,
0.7 p.b.w. of 9-phenylacridine, and
0.07 p.b.w. of a blue azo dyesytuff obtained by coupling 2,4-dinitro-6-chloro-benzene diazonium salt with 2-methoxy-5-acetylamino-N-cyanoethyl-N-hydroxyethyl aniline, in
30 p.b.w. of butanone,
12 p.b.w. of butyl acetate, and
12 p.b.w. of ethylene glycol monomethyl ether.

Electrochemically roughened and anodically oxidized aluminum which had an oxide layer of 2 g/m$^2$ and which had been pretreated with an aqueous solution of polyvinylphosphonic acid was spin-coated with the solution, in such a manner that a dry layer weight of 4 g/m$^2$ was obtained. The plate was then provided with a top layer of polyvinyl alcohol, which had a weight of 4 g/m$^2$. The printing plate was cut into two halves, and the two halves were exposed for 2 seconds by means of a 5 kW metal halide lamp, under a 13-step continuous tone wedge and halftone step wedges having 60 and 120 lines/cm, respectively.

Thereafter, development was performed using a developer of the following composition:
3.0 p.b.w. of sodium metasilicate×9H$_2$O,
0.03 p.b.w. of a non-ionogenic surfactant (coconut fatty alcohol polyoxyethylene ether having about 8 oxyethylene units)
0.003 p.b.w. of an anti-foam agent, and
96.967 p.b.w. of deionized water.

5 (6) fully cross-linked wedge steps were obtained. After developing, one of the two halves of the lithographic printing plate was baked for 5 minutes at 230° C.

Comparative printing tests resulted in a higher print run for the baked printing plate.

EXAMPLE 5

A phenoplast laminate board clad with a 35 μm thick copper foil was spin-coated with the coating solution described in Example 4, in a way such that a dry layer weight of 7 g/m² was obtained.

The plate was exposed for 40 seconds through a line original having line widths and distances as small as 80 μm and then developed for 60 seconds with 0.8% strength sodium carbonate solution. Thereafter, etching was performed with ammoniacal copper chloride solution (pH 8.5) at 48° C. and the resist stencil was removed with a 5% strength aqueous solution of KOH at 50° C.

The copper structures were perfectly reproduced.

EXAMPLE 6

A biaxially oriented and thermoset 25 μm thick polyethylene terephthalate film was spin-coated with a solution comprising:
13 p.b.w. of the terpolymer described in Example 1a,
6.4 p.b.w. of the polyethylene glycol-400-dimethacrylate
0.2 p.b.w. of 9-phenylacridine,
0.01 p.b.w. of azo dyestuff 5-nitro-2-[2-methyl-4-(N-ethyl-N-cyanoethyl)amino-phenylazo-]benzthiazole, and
0.02 p.b.w. of the blue dyestuff described in Example 4, in
18 p.b.w. of butanone and
18 p.b.w. of ethanol,
such that a dry layer weight of 40 g/m² was obtained after drying at 100° C.

In a commercially available laminating device, the dry resist film thus prepared was laminated, at 120° C., onto a preheated phenoplast laminate board clad with a 35 μm thick copper foil and exposed for 4 seconds in a commercially available exposing apparatus. The original used was a line original having line widths and distances as small as 80 μm.

After the exposure, the polyester film was peeled off and the layer was developed with a 0.8% strength solution of sodium carbonate for 90 seconds in a spray developing apparatus. Then the board was rinsed for 30 seconds with tap water, etched for 30 seconds in a 15% strength ammonium peroxydisulfate solution, rinsed again with tap water, dipped for 30 seconds into 10% strength sulfuric acid and then electroplated in the following electrolyte baths:

1. 50 minutes in a copper electrolyte bath from Messrs. Schloetter, Geislingen/Steige, "Glanzkupfer-Bad PC" (Bright Copper Bath PC) type
   Current density: 2.5 A/dm²
   Metal build-up: about 25 μm
   Temperature: room temperature
2. For 15 minutes in a lead tin bath LA from Messrs. Schloetter, Geislingen/Steige,
   Current density: 2 A/dm²
   Metal build-up: 15 μm
   Temperature: room temperature The board did not display any undercuttings or damage.

It was then possible to decoat the board in a 5% strength solution of KOH at 50° C. and to remove the bared copper by etching in customary etching media.

EXAMPLE 7

In anology with Example 6, a resist layer was prepared using the following coating solution:
6.5 p.b.w. of the terpolymer described in Example 1a,
5.6 p.b.w. of a reaction product obtained from 1 mole of trimethyl hexamethylene diisocyanate and 2 moles of hydroxyethyl methacrylate,
0.2 p.b.w. of 9-phenylacridine, and
0.035 p.b.w. of the blue dyestuff described in Example 4, in
14 p.b.w. of butanone and
9 p.b.w. of ethanol.

Exposure, developing and electroplating were performed as described in Example 6.

As before, this plate did not display any undercuttings or damage.

What is claimed is:

1. A radiation-polymerizable mixture, comprising:
   (a) a compound which has at least two terminal ethylenically unsaturated groups and which forms a cross-linked polymer by means of addition chain polymerization initiated by free radicals,
   (b) a polymeric binder in an amount sufficient to produce, when heated, said cross-linked polymer, and
   (c) a radiation-activatable polymerization initiator in an amount sufficient to initiate polymerization, wherein said binder comprises a copolymer with units of the formula

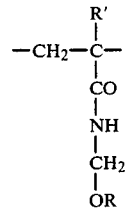

wherein:
   R' denotes a hydrogen atom or a methyl group, and
   R denotes a hydrogen atom, a lower alkyl group, a lower acyl group, or a lower hydroxyalkyl group, said copolymer being present in an amount sufficient to provide a sufficient naumber of ROCH$_2$ groups for cross-linking.

2. A radiation-polymerizable mixture as claimed in claim 1, wherein said copolymer further includes units having lateral carboxyl groups.

3. A radiation-polymerizable mixture as claimed in claim 2, wherein said copolymer comprises a terpolymer which includes:
   an acrylic or methacrylic acid,
   an acryl- or methacrylamide having ROCH$_2$-groups at the nitrogen, and
   an alkyl acrylate or alkyl methacrylate.

4. A radiation-polymerizable mixture as claimed in claim 3, wherein said terpolymer comprises about 10 to 35 percent by weight of units formed by acrylic or methacrylic acid, about 15 to 60 percent by weight of units formed by a substituted acryl- or methacrylamide and about 25 to 75 percent by weight of units formed by an alkyl acrylate or alkyl methacrylate.

5. A radiation-polymerizable mixture as claimed in claim 3, wherein said copolymer comprises an alkyl methacrylate, said alkyl group comprising about 4 to 12 carbon atoms.

6. A radiation-polymerizable mixture as claimed in claim 1, wherein the mixture comprises about 40 to 90 percent by weight of said binder, about 10 to 60 percent by weight of said polymerizable compound and about 0.01 to 10 percent by weight of said initiator.

7. A radiation-polymerizable mixture as claimed in claim 1, further comprising a low molecular weight compound, said compound being cross-linkable at an elevated temperature with said binder or said polymerizable compound.

8. A radiation-polymerizable mixture as claimed in claim 5, wherein said terpolymer comprises a polymer of methacrylic acid, N-butoxymethyl methacrylamide and hexyl methacrylate.

9. A radiation-polymerizable mixture as claimed in claim 1, wherein R denotes an alkyl group comprising about 1 to 6 carbon atoms.

10. A radiation-polymerizable mixture as claimed in claim 1, wherein R denotes an alkyl group comprising about 1 to 4 carbon atoms.

11. A radiation-polymerizable mixture as claimed in claim 1, wherein R denotes an acyl group comprising about 1 to 4 carbon atoms.

12. A radiation-polymerizable mixture as claimed in claim 4, wherein said terpolymer comprises from about 20 to 50% by weight of said substituted acryl- or methacrylamide.

13. A radiation-polymerizable mixture as claimed in claim 6, wherein said mixture comprises from about 55 to 85% by weight of said binder.

14. A radiation-polymerizable mixture, comprising:
(a) from about 10 to 60 percent by weight of a compound which has at least two terminal ethylenically unsaturated groups and which forms a cross-linked polymer by means of addition chain polymerization initiated by free radicals,
(b) from about 40 to 90 percent by weight of a polymeric binder, and
(c) from about 0.01 to 10 percent by weight of a radiation-activatable polymerization initiator, wherein said binder comprises from about 15–60 percent by weight of a copolymer with units of the formula

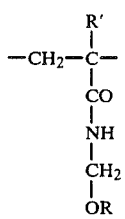

wherein:
R' denotes a hydrogen atom or a methyl group and
R denotes a hydrogen atom, a lower alkyl group, a lower acyl group or a lower hydroxyalkyl group.

* * * * *